(12) United States Patent
Minamiura et al.

(10) Patent No.: US 6,812,670 B2
(45) Date of Patent: Nov. 2, 2004

(54) BATTERY CONTROL DEVICE

(75) Inventors: Keiichi Minamiura, Aichi (JP); Toshiaki Nakanishi, Aichi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 10/233,043

(22) Filed: Aug. 30, 2002

(65) Prior Publication Data

US 2003/0042866 A1 Mar. 6, 2003

(30) Foreign Application Priority Data

Aug. 31, 2001 (JP) ........................................ 2001-264636

(51) Int. Cl.[7] .................................................. H02J 7/00
(52) U.S. Cl. ...................................................... 320/116
(58) Field of Search ................................ 320/116, 119, 320/122, 134, 136; 324/426, 433

(56) References Cited

U.S. PATENT DOCUMENTS 5,049,803 A * 9/1991 Palanisamy ................. 320/132
6,255,803 B1 * 7/2001 Ishihara et al. ............. 320/134
6,278,257 B1 * 8/2001 Takada et al. ............... 320/116

FOREIGN PATENT DOCUMENTS

| JP | 07-137612 | 5/1995 |
| JP | 09-117072 | 5/1997 |
| JP | 11-178225 | 7/1999 |

OTHER PUBLICATIONS

Machine translation and Japanese document of JP 07 137612, published May 30, 1995, 31 pages.*

* cited by examiner

Primary Examiner—Pia Tibbits
(74) Attorney, Agent, or Firm—Snell & Wilmer, LLP

(57) ABSTRACT

The present invention provides a battery control device for controlling charging and discharging operations performed on a battery pack in which a plurality of serially-connected battery blocks each include a plurality of battery cells, and the device includes: a voltage measurement section for measuring a battery voltage value for each voltage detection unit determined according to a prescribed condition based on at least one battery characteristic; and an abnormal battery detection section for detecting an abnormal battery based on the battery voltage value measured by the voltage measurement section.

3 Claims, 3 Drawing Sheets

BATTERY CONTROL DEVICE

BACKGROUND OF THE INVENTION

1. Field of the Invention

The present invention relates to a battery control device for controlling charging and discharging operations with respect to battery packs mounted on, for example, a variety of electric vehicles including automated guided vehicles, hybrid electric vehicles and fuel battery electric vehicles, and devices driven by rechargeable batteries, such as uninterruptible power supplies.

2. Description of the Related Art

Conventionally, as a low-pollution vehicle designed for the purpose of solving environmental problems and energy problems, an electric vehicle such as a HEV (hybrid electric vehicle) and a PEV (pure electric vehicle) has received a great deal of attention. The electric vehicle has rechargeable batteries (a battery pack) mounted therein, and the electric power of the battery pack drives an electric motor so as to run the electric vehicle.

The electric vehicle includes an inverter for controlling motor drive and a battery control device for obtaining an output state of the battery pack and controlling charging and discharging operations with respect to the battery pack according to the output state of the battery pack, so as to stably supply the electric power to the electric motor via the inverter.

The battery control device measures a battery voltage, etc., of each battery block (which includes a plurality of combined battery cells) included in the battery pack so as to calculate a remaining capacity SOC (State Of Charge; a value representing how much electric power remains in the rechargeable batteries) of the battery pack based on the measurement result. For example, the battery control device controls the charge and discharge operations with respect to the battery pack so as to keep the remaining capacity SOC of the battery pack within a prescribed range. Further, the battery control device detects abnormality of the battery cell in each battery block based on the battery voltage measured for each battery block.

For example, in Japanese Laid-Open Patent Publication No. 7-137612, entitled "Battery Diagnostic Device", the battery pack is divided into voltage detection units (battery blocks) each including n battery cells and is monitored by comparing the respective measured voltage values of the voltage detection units with one another so as to detect the abnormal battery cell in the battery pack. Specifically, a voltage of each battery block in the battery pack is measured by a voltage sensor provided in each battery block. When a measured battery block voltage has the same value as the other battery block voltages, the measured battery block voltage is determined to be normal. On the other hand, when the measured battery block voltage has a different value from the other battery block voltages, the measured battery block voltage is determined to be abnormal. For example, in the case where the abnormal battery block includes internal short-circuit battery cells, the detected battery pack voltage is always lower than the other battery pack voltages by a voltage level equivalent to a reduced voltage level of the short-circuit battery cells. Further, in the case where the abnormal battery block includes battery cells in which internal resistance is increased when any abnormality is caused, the level of the detected battery pack voltage is detected to be lower than those of the other battery pack voltages during a discharge operation (during the operation of the battery pack), and the level of the detected battery pack voltage is detected to be higher than those of the other normal battery pack voltages during a regeneration operation (or a charge operation).

Further, in Japanese Laid-Open Patent Publication No. 9-117072, entitled "Protection Network for Secondary Battery", the respective voltages of voltage detection units (battery blocks) in the battery pack is measured so as to be compared to one another. When the difference in voltage level between the voltage detection units exceeds a prescribed value, it is determined that there is abnormality in the battery pack, so that current flowing into the battery pack is blocked. Specifically, when spot-welded electrical connections in a cell bank are broken, the difference in voltage level between the cell banks is detected, so that a closed circuit connected to the battery pack is electrically disconnected from the battery pack so as to protect the battery pack from being overcharged or overdischarged.

Furthermore, in Japanese Laid-Open Patent Publication No. 11-178225, entitled "Battery Control Device", the voltage detection units (battery blocks) in the battery pack are grouped according to their temperatures such that voltage detection units having similar temperatures belong to the same group. A maximum voltage difference is calculated for each group. When the calculated maximum voltage difference value of a group is equal to or more than a first threshold, the amount of electric power discharged from that group is limited. Further, when the calculated maximum voltage difference value is equal to or more than a second threshold, the discharge operation is terminated. In this manner, these two steps of controlling the discharge operation are performed according to the state of charge of the battery pack so as to maintain the reliability of the battery pack.

However, in Japanese Laid-Open Patent Publication No. 7-137612, unevenness in battery capacity is not taken into consideration so that the settings of voltage levels are not established in consideration of battery characteristics. Therefore, when the difference in voltage detected between the battery blocks in the battery pack is equal to or more than a prescribed value, the battery pack is immediately and erroneously determined to be abnormal, thereby deteriorating the reliability of the battery pack.

Further, in Japanese Laid-Open Patent Publication No. 9-117072, it is detected that electrical connections in the voltage detection unit are broken based on the difference between the measured voltage values. However, this is merely used for protecting the battery pack from being overcharged and overdischarged so as to maintain the reliability of the battery pack but is not used for detecting the abnormality (overdischarge) of a battery cell in the battery pack.

Furthermore, in Japanese Laid-Open Patent Publication No. 11-178225, the number n of battery cells included in each voltage detection unit (battery block) is required to be sufficient to allow for the distinction between the two-step thresholds. However, unevenness in internal resistance among the battery cells is not taken into consideration, and therefore the number n of the battery cells included in each battery block cannot be sufficiently large. In particular, when the battery pack is used with a high current, there is a possibility that the abnormality of the battery cells might be mistakenly detected, and therefore it is necessary to considerably limit the number of battery cells included in each voltage detection unit. This deteriorates the reliability of the battery pack.

In the above-described conventional technologies, the battery voltage is measured for each voltage detection unit (battery block) so as to maintain the reliability of the battery pack. However, the battery characteristics, such as unevenness in internal resistance is not taken into consideration. In such voltage detection for each voltage detection unit (battery block) which does not take the battery characteristics into consideration, it is not possible to detect abnormal battery blocks with precision, thereby deteriorating the reliability of the battery pack.

SUMMARY OF THE INVENTION

According to one aspect of the present invention, there is provided a battery control device for controlling charging and discharging operations performed on a battery pack in which a plurality of serially-connected battery blocks each include a plurality of battery cells, and the device includes: a voltage measurement section for measuring a battery voltage value for each voltage detection unit determined according to a prescribed condition based on at least one battery characteristic; and an abnormal battery detection section for detecting an abnormal battery based on the battery voltage value measured by the voltage measurement section.

In one embodiment of the invention, the prescribed condition based on the at least one battery characteristic is at least any one of unevenness in internal resistance, precision in battery voltage measured by the voltage measurement section, and the number of battery cells sharing an internal space in each battery case.

In another embodiment of the invention, the number N of the battery cells in each voltage detection unit is determined according to any one of the following conditions (1) through (6):

(1) Max ($|I1|$, $|I2|$)×2$\Delta R0$×N<Valm, where I1 denotes current input to a battery cell (I1≠0), I2 denotes current output from the battery cell (I2≠0), N denotes a positive integer, a range of abnormal detection current of a battery is I1 to I2 ($|I1|\geq|I2|$) (ampere), unevenness in internal resistance of a battery cell is $\pm\Delta R0$ (ohm), and a voltage value per battery cell determined by battery characteristics is Valm (volt);

(2) I2 denotes discharge current and Valm denotes electric potential at which hydrogen is generated from a battery electrolyte according to condition (1);

(3) both I1 and I2 denote current values in the vicinity of zero, and Valm denotes an open-circuit voltage of the battery cell;

(4) a voltage detection unit N obtained according to condition (1) is multiplied by the precision, $\pm\Delta$Vacy (%), of a voltage detection unit system, such that Max ($|I1|$, $|I2|$)×2$\Delta R0$×2 $\Delta$Vacy×N<Valm;

(5) Max ($|I1|$, $|I2|$)×2$\Delta R0$×N<Ralm×Max ($|I1|$, $|I2|$);

where I1 denotes current input to a battery (I1≠0), I2 denotes current output from a battery (I2≠0), N denotes a positive integer, a range of abnormal detection current of a battery is I1 to I2 ($|I1|\geq|I2|$) (ampere), unevenness in internal resistance of a battery cell is $\pm\Delta R0$ (ohm), and internal resistance per battery cell determined by battery characteristics is Ralm (ohm); and (6) in a battery pack including battery blocks having space-sharing structure between battery cells,

N0≦N≦A×N0, where the number of space-sharing battery cells is A (A is a positive integer), and N determined according to the conditions (1)–(5) is N0.

Thus, the invention described herein makes possible the advantages of providing a battery control device for detecting an abnormal battery using a battery voltage measured for each voltage detection unit, which is optimized according to battery characteristics, so as to reduce the possibility of mistakenly detecting an abnormal battery, thereby improving the reliability of a battery pack.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments in which a battery control device according to the present invention is applied to an electric circuit for driving a HEV are described with reference to the drawings.

Figure 1:
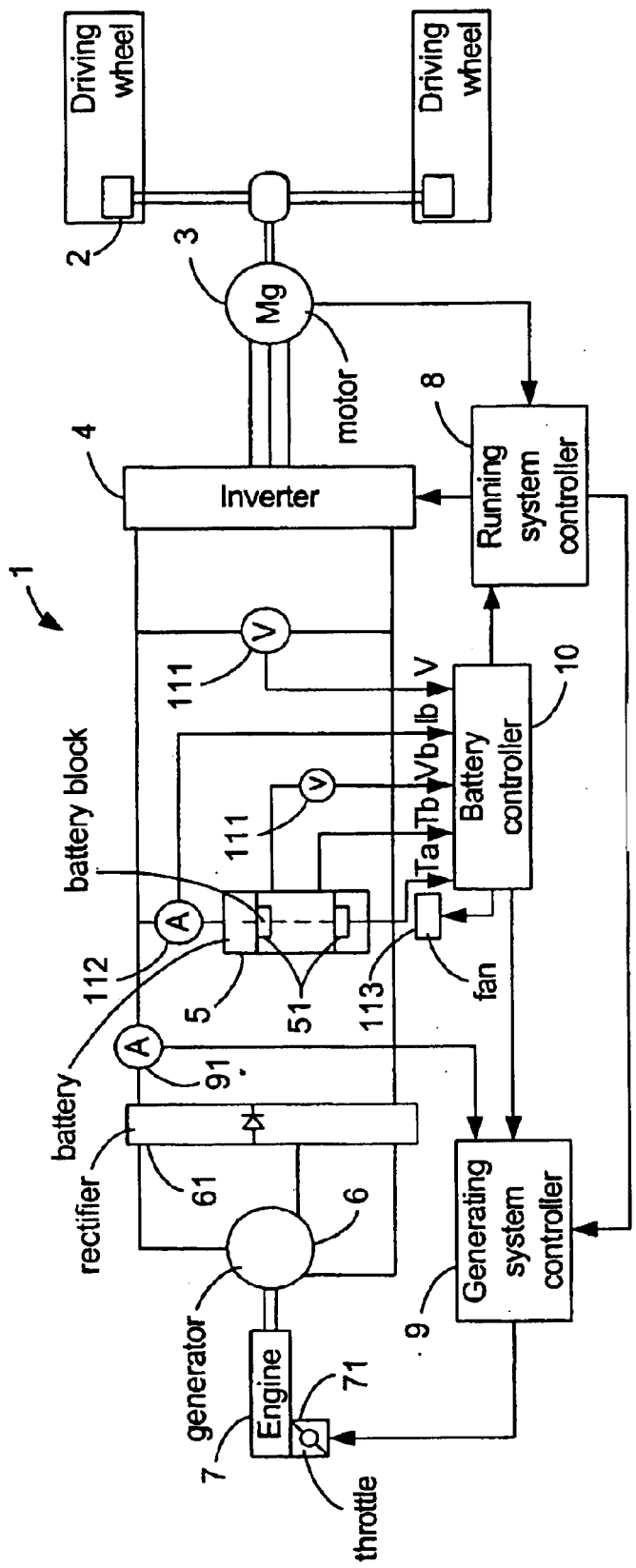
FIG. 1 is a block diagram showing a schematic structure of a HEV according to an embodiment of the present invention.

FIG. 1 is a block diagram showing a schematic structure of a HEV 1 according to an embodiment of the present invention. In FIG. 1, the HEV 1 includes: driving wheels 2; a motor 3 which is a power source for the driving wheels 2; an inverter 4 for supplying the electric power to the motor 3; a battery 5 for supplying the electric power to the inverter 4; a motor generator 6 for battery charge and power supply; an engine 7 for driving the motor generator 6; a running system controller 8 for controlling the driving of the inverter 4; a generating system controller 9 for controlling the driving of the engine 7; and a battery controller 10 which is the battery control device of the present invention for outputting information about the battery 5 to the running system controller 8 and the generating system controller 9.

The driving wheels 2 are front wheels and/or rear wheels for moving the body of the HEV 1, and the power is actually transmitted to the driving wheels 2.

The motor 3 has an electromotive function of rotationally driving the driving wheels 2 when being supplied with electric power by at least either the motor generator 6 or the battery 5 at the time of starting or accelerating the vehicle and a power generation function for performing power regeneration at the time of slowing down or braking the vehicle so as to charge the battery 5. The motor 3 has an output shaft linked to a transmission (not shown) for reducing the rotation speed of the output shaft via internal gears. The driving force is transmitted through differential gears to the drive shaft linked to the driving wheels 2.

The inverter 4 converts the electric power from the battery 5 so as to apply a prescribed three-phase high voltage to the motor 3, thereby rotationally driving the motor 3.

The battery 5 is a main battery or a battery pack including, for example, alkaline storage batteries, nickel metal hydride storage batteries, or the like. The battery 5 includes a plurality of serially-connected modules each consisting of, for example, six battery cells sealed in a battery case. In FIG. 1, a battery block 51 can be formed of two modules.

Alternatively, as described in detail below, the battery block 51 can have a space-sharing structure between the battery cells by allowing two modules to be in communication with one another. For example, a voltage of DC 20 V is applied to an output of each battery block 51, and a voltage of up to DC 400 V is applied to an output of the entire battery 5 including a plurality of battery blocks 51. The battery 5 is connected to the inverter 4 and the motor generator 6.

Figure 3:
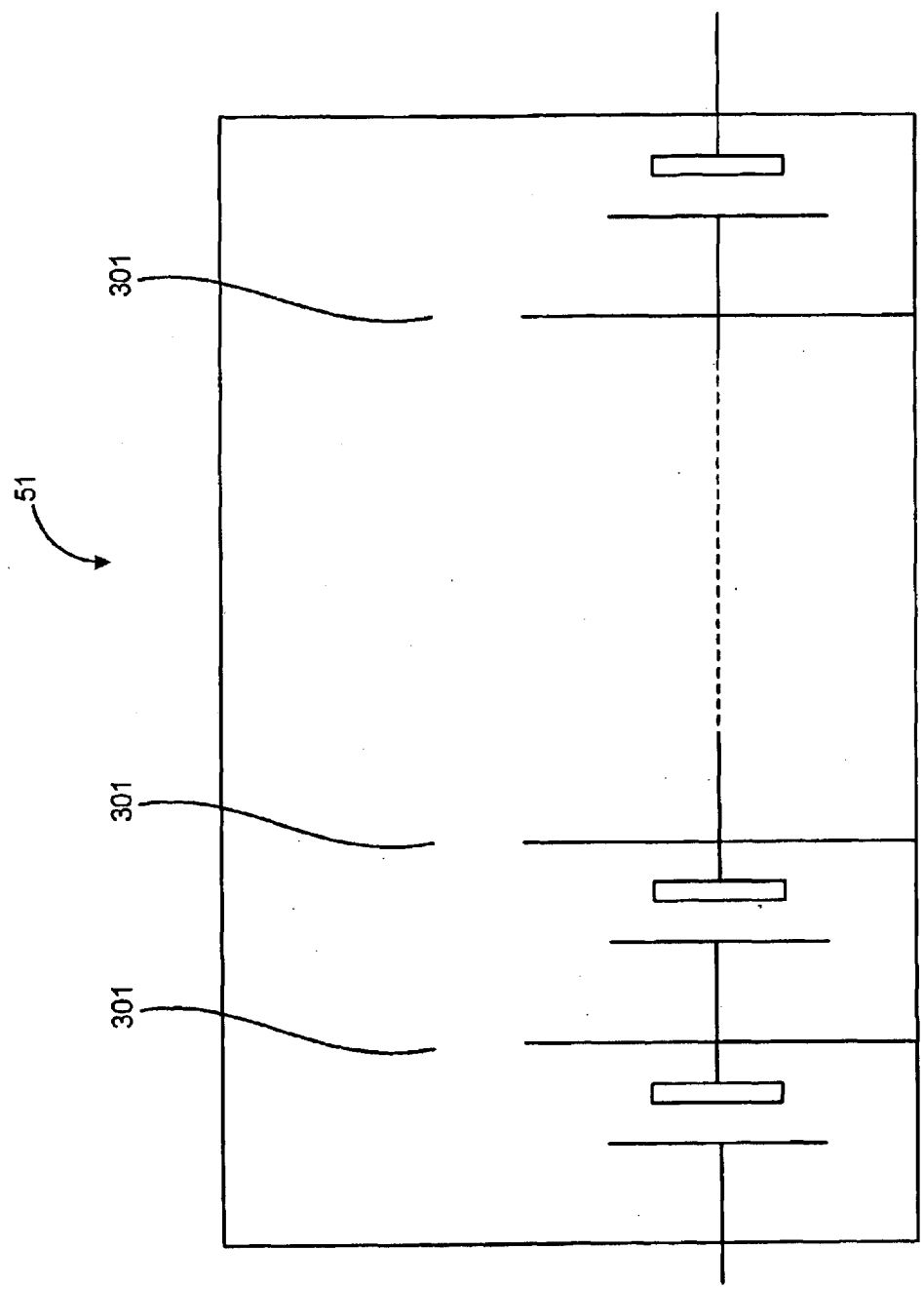
FIG. 3 shows an example of a schematic battery block of FIG. 1, having a number of battery cells sharing an internal space.

FIG. 3 shows a schematic example of a battery block with a number of cells sharing an internal space 301.

The space-sharing structure between the battery cells of the battery 5 is now described. Each internal space-sharing module includes n electrically-connected battery cells. In the internal space-sharing module, a space 301 above battery cells in the module is shared between the battery cells. Unlike a module in which the space above battery cells is not shared between the battery cells, when a hole is made a battery case of the internal space-sharing module, all of the n battery cells are considerably influenced by that hole. Therefore, the battery 5 including the internal space-sharing modules facilitates the detection of an abnormal battery cell.

The motor generator 6 is a three-phase AC generator for supplying the electric power to the battery 5 via a rectifier 61 so as to charge the battery 5 and for directly supplying the electric power to the inverter 4. Although there are motor generators available to function as a three-phase AC electric motor, rather than as a three-phase AC generator, as an example, the motor generator 6 is described herein as a three-phase AC generator.

The engine 7 is an internal combustion engine, such as a gasoline engine or a diesel engine, which includes an output shaft linked to a rotor member of the motor generator 6. The amount of electric power generated by the engine 7 is controlled by a throttle 71 for controlling the amount of fuel supplied to the motor generator 6 so as to control the rotation of the motor generator 6.

The running system controller 8 receives a control signal from a battery controller 10 while receiving information about the state of rotation of the motor 3 so as to control the inverter 4, thereby stably controlling the running speed of the vehicle via the motor 3. Specifically, the running system controller 8 controls manipulated variables of an accelerator pedal, environmental conditions, such as a temperature of cooling water, an intake temperature, an intake pressure, or the like.

The generating system controller 9 receives a control signal from the battery controller 10 while receiving information about a generated current value detected by a current measurement device 91 so as to control the rotation force of the engine 7 via the throttle 71 for controlling the amount of fuel to be supplied.

In the case of a hybrid electric vehicle in which the motor generator 6 generates the electric power so as to charge the battery 5, the battery controller 10 appropriately manages the state of the electric power stored in the battery 5 so as to collect sufficient electric power regenerated when braking the hybrid electric vehicle to enhance energy efficiency, and outputs battery information to the running system controller 8 and the generating system controller 9 so as to achieve the accelerated speed desired by a driver when accelerating the vehicle.

It is very important to a vehicle including the battery 5 as a power source, such as the hybrid electric vehicle, to precisely detect and appropriately control the amount of electric power stored in the battery 5 using the battery controller 10. The battery controller 10 receives information about battery cells included in the battery 5, e.g., information about voltage, current, a temperature of the battery 5, which is used for estimating the amount of stored electric power (remaining capacity SOC) in the battery 5, malfunction(abnormal battery cells), or the like. The battery controller 10 is described in detail below.

Figure 2:
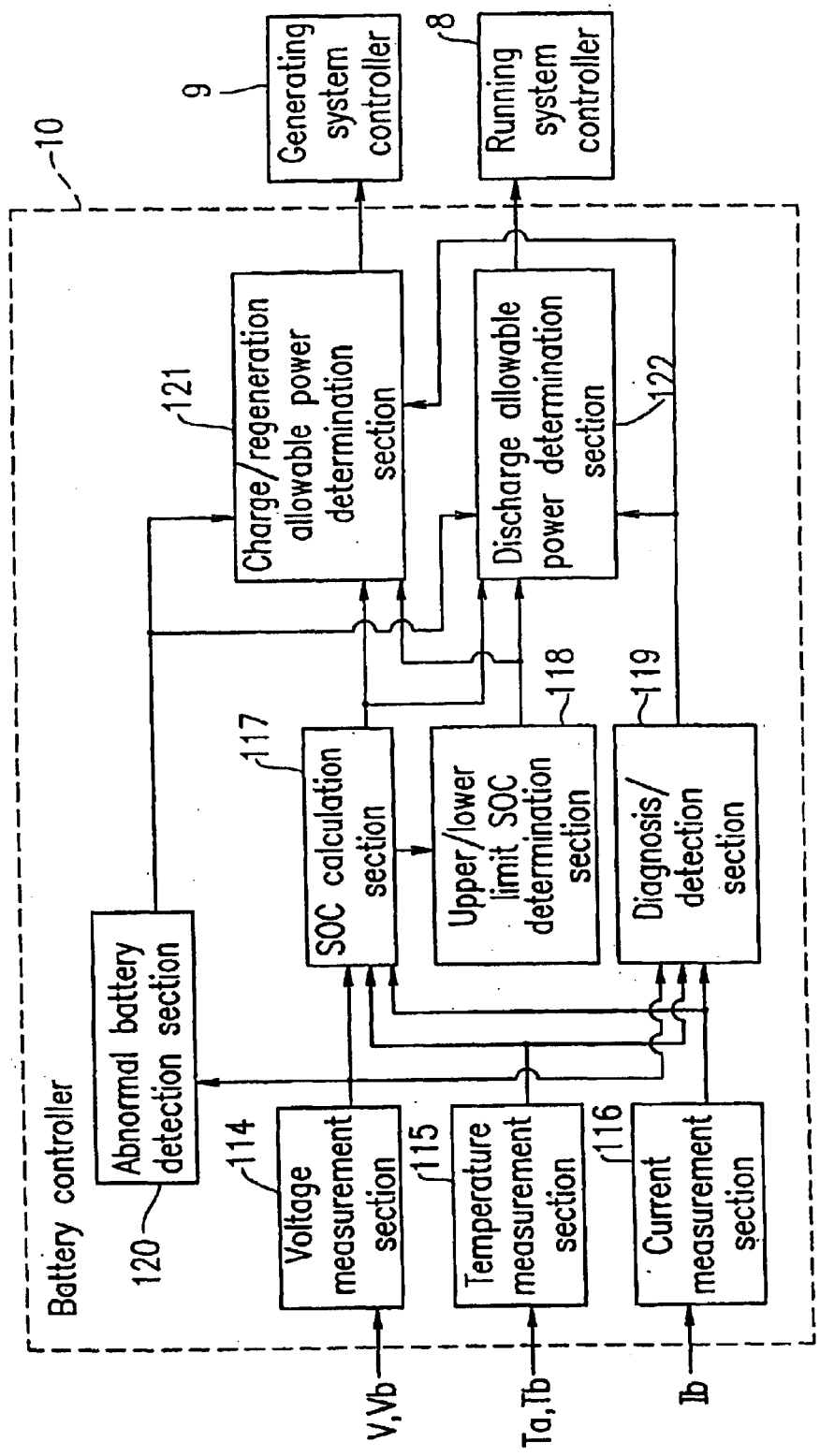
FIG. 2 is a block diagram showing a detailed structure of a battery controller shown in FIG. 1.

As shown in FIG. 2, the battery controller 10 includes: a voltage measurement section 114; a temperature measurement section 115; a current measurement section 116; a SOC calculation section 117; an upper/lower limit SOC detection section 118; a diagnosis/detection section 119; an abnormal battery 11 detection section 120; a charge/regeneration allowable power determination section 121; and discharge allowable power determination section 122. The battery controller 10 receives formation about battery temperatures Ta and Tb, a battery output voltage V and an output voltage Vb detected for each battery block 51 by voltage measurement devices 111a and 111b (FIG. 1), and a battery output current Ib detected by a current measurement device 112 (FIG. 1) so as to calculate the state of charge of the battery 5 as the remaining capacity SOC (%). The battery controller 10 controls charge and discharge operations performed o the battery 5 via the running system controller 8 and the generating system controller 9 according to the calculated remaining capacity SOC while driving a fan 113 (FIG. 1) according to the detected battery temperature Ta and Tb so as to cool the battery 5. As a characteristic of the present invention, the battery controller 10 detects a battery block corresponding to the a battery case having a hole or cracks and controls the detected battery block so as not to be overcharged.

The voltage measurement section 114 measures a battery block voltage for each battery detection unit determined according to prescribed conditions based on the battery characteristics, i.e., a block voltage Vb for each battery block 51 while measuring a voltage V applied to the entire battery 5 based on a voltage value detected by the voltage measurement device 111a. The voltage detection unit is determined according to the prescribed conditions based on the battery characteristics, which is further described in detail below after the following descriptions of elements 115–122 of the battery controller 10.

The temperature measurement section 115 measures an ambient temperature Ta variable due to heat generated by the battery 5, a battery block temperature Tb of each battery block 51, and a temperature of a cooling medium (not shown) based on the respective values detected by temperature sensors (not shown) provided as temperature detection sections for detecting battery temperatures at a plurality of locations, such as the periphery of the battery 5, battery blocks 51, the cooling medium, etc.

The current measurement section 116 measures a battery output current Ib provided by the battery 5 based on a current value detected by the magnetic compensation-type (or shunt resistance-type) current measurement device 112 (current sensor) when charging or discharging the battery 5.

The SOC calculation section 117 calculates the remaining capacity SOC for each battery block 51 based on a voltage applied to each battery block 51 measured by the voltage measurement section 114, a temperature of each battery block 51 measured by the temperature measurement section 115, and a current applied to each battery block 51 measured by the current measurement section 116 while calculating the remaining capacity SOC of the entire battery 5.

The upper/lower limit SOC determination section 118 outputs an upper/lower limit SOC determination signal which represents that the remaining capacity SOC currently obtained by the SOC calculation section 117 has reached an upper/lower limit SOC value. The upper/lower limit SOC value refers to an upper/lower limit value within a prescribed intermediate region of the remaining capacity SOC in which the remaining capacity SOC is controlled by performing charging and discharging operations on the battery 5. Further, a SOC induction target value is set in the middle of the prescribed intermediate region.

This prescribed intermediate region is set for the purpose of leaving sufficient remaining capacity SOC in the battery 5 so as to satisfy power assist requirements when starting or running the electric vehicle while leaving sufficient space for the battery 5 to be charged so as to collect energy as efficiently as possible when slowing down or braking the electric vehicle. Since it is difficult to predict when the electric vehicle is braked, it is desirable to maintain the remaining capacity SOC at such an extent as to enable the battery 5 to receive the electric power generated by braking. On the other hand, a certain extent of remaining capacity SOC is required so as to obtain sufficient acceleration desired by the driver only with the electric power supplied by the motor 3. In order to satisfy these requirements, the remaining capacity SOC of the battery pack is controlled so as to be, for example, between about 40% and about 80% of the capacity of the battery pack.

The diagnosis/detection section 119 outputs a diagnosis/detection signal based on a battery block voltage Vb and a battery voltage V which are measured by the voltage measurement section 114, battery temperatures Ta and Tb measured at appropriate places by the temperature measurement section 115, and a battery output current Ib measured by the current measurement section 116.

The abnormal battery detection section 120 distinguishes between a normal battery and an abnormal battery by detecting the abnormal battery based on a battery voltage measured for each battery block by the voltage measurement section 114 when a difference in voltage level between the normal battery and the abnormal battery is out of a prescribed range during a battery charging operation. The abnormal battery detection section 120 detects a drop in voltage due to a hole made in the battery case, a drop in voltage due to a minor short circuit, and a rise in voltage due to a rise in internal resistance. Abnormal batteries are detected by the abnormal battery detection section 120 as being batteries enclosed in battery cases with holes, minor short-circuit batteries, and batteries in which there is a rise in internal resistance. Although not shown in FIG. 2, according to the details of the abnormality to be detected, the detection of the abnormal battery can be performed with reference to a variety of measured values, such as a battery ambient temperature Ta measured by the temperature measurement section 115, a battery block temperature Tb, a temperature of a cooling medium, a battery output current Ib measured by the current measurement section 116, etc., which are input to the abnormal battery detection section 120.

The charge/regeneration allowable electric power determination section 121 controls a charging operation performed on the battery 5 by outputting to a generating system controller 9 an electric power determination control signal (a control signal) for determining charge/regeneration allowable electric power based on the remaining capacity SOC calculated by the SOC calculation section 117, an upper/lower limit SOC determination signal output by the upper/lower limit SOC determination section 118, a diagnosis/detection signal output by the diagnosis/detection section 119, and a detection signal output by the abnormal battery detection section 120.

The discharge allowable electric power determination section 122 controls a discharging operation performed on the battery 5 by outputting to a running system controller 8 an electric power determination control signal (a control signal) for determining discharge allowable electric power based on the remaining capacity SOC obtained by the SOC calculation section 117, the upper/lower limit SOC determination signal output by the upper/lower limit SOC determination section 118, the diagnosis/detection signal output by the diagnosis/detection section 119, and the detection signal output by the abnormal battery detection section 120. In particular, the discharge allowable electric power determination section 122 controls the amount of electric power discharged from the battery 5 so as to correspond to a prescribed value when the detection signal, which represents the presence of an abnormal battery cell, is input to the discharge allowable electric power determination section 122 by the abnormal battery detection section 120.

The charge/regeneration allowable electric power determination section 121 and the discharge allowable electric power determination section 122 function together as a charge/discharge induction section. The charge/discharge induction section induces the battery 5 to be charged and discharged according to power assist requirements such that the calculated remaining capacity SOC is within the prescribed intermediate region.

Here, the number n of the battery cells in each voltage detection unit measured by the voltage measurement section 114 is determined according to any one of the following prescribed conditions (1) through (6) based on battery characteristics, such as unevenness in internal resistance, precision in battery voltage measured by the voltage measurement section 114, the number of battery cells sharing an internal space 301 in a battery case, etc:

(1) Max $(|I1|, |I2|) \times 2\Delta R0 \times N < Valm$,
where I1 denotes current input to a battery cell (I1≠0), I2 denotes current output from the battery cell (I2≠0), N denotes a positive integer, a range of abnormal detection current of a battery is I1 to I2 ($|I1| \geq |I2|$) (ampere), unevenness in internal resistance of a battery cell is $\pm\Delta R0$ (ohm), and a voltage value per battery cell determined by battery characteristics is Valm (volt);

(2) I2 denotes discharge current and Valm denotes electric potential at which hydrogen is generated from a battery electrolyte according to condition (1);

(3) Both I1 and I2 denote current values in the vicinity of zero, and Valm denotes an open-circuit voltage of the battery cell;

(4) A voltage detection unit N obtained according to condition (1) is multiplied by the precision, $\pm\Delta Vacy$ (%), of a voltage detection unit system, such that
Max $(|I1|, |I2|) \times 2\Delta R0 \times 2\Delta Vacy \times N < Valm$;

(5) Max $(|I1|, |I2|) \times 2\Delta R0 \times N < Ralm \times Max(|I1|, |I2|)$,
where I1 denotes current input to a battery (I1≠0), I2 denotes current output from a battery (I2≠0), N denotes a positive integer, a range of abnormal detection current of a battery is I1 to I2 ($|I1| \geq |I2|$) (ampere), unevenness in internal resistance of a battery cell is $\pm\Delta R0$ (ohm), and internal resistance per battery cell determined by battery characteristics is Ralm (ohm);

(6) In a battery pack including battery blocks having space-sharing structure between battery cells,
$N0 \leq N \leq A \times N0$, where the number of space-sharing battery cells is A (A is a positive integer), and N determined according to conditions (1)–(5) is N0.

Conditions (1)–(6) are described in detail below.

For example, in a battery pack system according to condition (1) in which the unevenness in internal resistance is ±0.2 milliohm, maximum current is 100 A and the electric potential at which hydrogen is generated from a battery electrolyte is 1.2 V, the expression of condition (1) becomes $100 \times 2 \times 0.2 \times 10^{-3} \times N < 1.2$, and therefore the number N of battery cells in a voltage detection unit is <30, whereby the number N of battery cells in the voltage detection unit can be 29 at maximum. In the case where the unevenness in internal resistance is ±0.1 milliohm and maximum current is 100 A, the number N of battery cells in a voltage detection unit is <60, and therefore the number N of battery cells in the voltage detection unit can be 59 at maximum. Accordingly, in the case of using the same battery pack system, a maximum value for the number N of battery cells in the voltage detection unit becomes large when using the battery cell having a small value of unevenness in internal resistance.

In this manner, the number N of battery cells in the voltage detection unit is determined so as to perform abnormality detection at a battery cell level in consideration of the unevenness in internal resistance of the battery cells. Further, as in the case of the unevenness in internal resistance, when the maximum input/output current Max ($|I1|$, $|I2|$) in the expression of condition (1) is changed (for example, when the number of battery cells in a battery pack is reduced, an input/output current value per battery cell is increased), the optimum number N of battery cells in the voltage detection unit is also changed. With respect to an electric vehicle having a different maximum input/output current value or an uninterruptible power supply, the optimum number N of battery cells in the voltage detection unit can be determined according to condition (1).

Conventionally, voltage detection has been performed on each battery block which is a voltage detection unit including, for example, 12 battery cells, and therefore the number of detection portions and the number of parts required for the detection are large in the entire battery pack, which complicates the wired circuit. Therefore, in order to reduce the number of detection portions and the required parts, it is desirable to increase the number N of battery cells in the voltage detection unit as much as possible. However, when the number of battery cells is increased so as to be equal to or more than the maximum number N of battery cells obtained according to conditions (1)–(6), there is a possibility that the abnormality in battery cells might not be detected so that battery abnormality is mistakenly detected.

Condition (2) is applied to a case of setting the number N of battery cells in the voltage detection unit such that the battery cells under condition (1) do not reach an electric potential at which hydrogen is generated.

Condition (3) is applied to a case of setting Valm as an open-circuit voltage of a battery cell in an application in which the input/output current under condition (1) is as small as being in the vicinity of zero.

Condition (4) is applied to a case of setting the number N of battery cells in the voltage detection unit such that the abnormality in battery cell can be detected in the case where precision error of a voltage detection system is added to condition (1).

Condition (5) is applied to a case of setting Valm as a product of an internal resistance value and a maximum input/output current value which is determined according to the battery characteristics.

Condition (6) is applied to case of detecting an abnormal battery cell having a defect in the airtightness thereof. In this case, the number N of battery cells in the space-sharing structure in the battery case of the battery 5 is determined. For example, in the case where the number N of battery cells sharing the upper space 301 (which are in communication with one another) in the battery case is six, when there is a hole made in the battery case, all of the six battery cells are influenced by the draining of liquid from the battery case, so that a rise in internal resistance becomes conspicuous and the capacity of the battery 5 is reduced since the hydrogen at the negative electrodes of all of the six battery cells is released from the hole to the outside of the battery 5. On the other hand, when one of the battery cells sharing the internal space 301 in the batter case (without a hole) is overcharged or overdischarged so that a gas is generated, the rest of the battery cells sharing the internal space 301 in the battery case absorbs the gas, and therefore a rise in internal pressure due to the generated gas is suppressed. Therefore, the more the space-sharing battery (battery becomes tolerant to a single overcharged or overdischarged battery cell the more the number of space-sharing battery cells is increased.

As described above, in the space-sharing battery, when there is a hole (crack) made in the battery case, all the battery cells sharing the internal space 301 in the battery case are influenced by the draining of the electrolyte, and therefore the rise in internal resistance become conspicuous, thereby facilitating detection of the abnormal battery having a hole. Accordingly, even when there is the number N of battery cells included in the battery block, it is possible to readily detect the internal resistance of the abnormal battery having a hole. Further, by increasing the number N of battery cells included in the battery block so as decrease the number of battery blocks in battery 5, the detection of the abnormal battery having a hole can be facilitated while reducing the portions at which voltage is detected, thereby simplifying voltage detection lines so as to realize safety improvement and cost reduction. This is particularly useful for an uninterruptible power supply (UPS) in which charge/discharge current is relatively small and which is used in the vicinity of the fully-charged state, and therefore unevenness in internal resistance of the battery cells or voltage difference between the battery cells is hardly caused.

Further, with respect to condition (6), in the battery cells sharing the internal space 301 in the battery case, when a defect in the airtightness is caused due to a hole (or cracks) in the battery case, a rise in internal resistance becomes conspicuous in all the battery cells sharing the internal space 301 in the battery case because of the reduction in electrolyte. Therefore, when the maximum number of battery detection units in the battery, which does not have a space sharing structure in the battery case, is set so as to be N0, the maximum number of voltage detection units in a battery in which the number of space-sharing cells is A can be set so as to be A×N0, and therefore the number N of battery cells in a voltage detection unit can be set so as to be equal to or lower than A×N0. Particularly, in the case of a simplified battery back which is normally charged with a small current as in the case of the USP, only at least a hole (cracks) made in the battery is required to be detected, and therefore this procedure is useful.

As described above, in order to improve the reliability of the battery pack, the number N of battery cells in the voltage detection unit in the battery pack can be set according to the battery characteristics.

The operation of the above-described battery control device according to the present invention is described in detail below with reference to FIG. 1.

When running the HEV 1, the inverter 4 used for running the vehicle is controlled via the running system controller 8 (inverter ECU; electrical control unit), and the engine 7 for power generation is controlled via the generating system controller 9 (engine ECU). These controls are performed based on manipulated variables of an accelerator pedal and a brake pedal, a shift range determined by a shift lever, battery information output by the battery controller 10 (battery ECU), such as storage state (the remaining capacity SOC) of the battery pack, battery malfunction (detection of the abnormal battery), etc.

On the other hand, when a drop in the amount of stored electric power (the remaining capacity SOC) of the battery 5 is detected via the generating system controller 9, the battery controller 10 controls the engine 7 so as to allow the motor generator 6 to generate the electric power for charging the battery 5 while controlling the motor 3 via the running system controller 8 so as to drive the motor 3 with the electric power generated by the battery 5 and the motor generator 6 for driving the electric vehicle. In this case, the engine 7 controls the power generation by the motor generator 6 so as to control magnetic field current of the motor generator 6 according to the current rotation speed.

Further, when the amount of stored electric power (the remaining capacity SOC) in the battery 5 is increased, the battery controller 10 controls the engine 7 via the generating system controller 9 and the running system controller 8 so as to suppress or stop the drive of the engine 7, and drives the motor 3 with the electric power from the battery 5 so as to use torque generated by the motor 3 for running the electric vehicle. When braking the electric vehicle, the motor 3 is caused to function as a generator so as to charge the battery 5 with the generated electric power.

In this case, with reference to FIG. 2, the abnormal battery detection section 120 compares differences in battery voltage levels between battery blocks for each battery block so as to detect a battery block having a battery voltage difference value greater than, for example, a value in a prescribed range, thereby detecting abnormal batteries including batteries with holes, minor short-circuit batteries, batteries in which there is a rise in internal resistance, etc.

As described above, according to this embodiment, the voltage measurement section 114 measures a battery voltage value for each voltage detection unit determined according to the conditions based on the battery characteristics, such as unevenness in internal resistance, precision of battery voltage measured by the voltage measurement section 114, the number of internal space-sharing battery cells in each battery case, etc., and the abnormal battery detection section 120 detects an abnormal battery based on the measured battery voltage value. Therefore, it is possible to prevent the abnormal battery from being mistakenly detected at a battery cell level, thereby improving the reliability of the battery pack. Further, according to this embodiment, it is possible to reduce the number of voltage detection units, whereby it is possible to prevent circuit complication by reducing the number of wire harnesses and the number of circuits in a battery monitoring section, and to realize improvement in economical efficiency.

As described above, according to the present invention, a voltage measurement section measures a battery voltage value for each voltage detection unit determined according to the conditions based on the battery characteristics, such as unevenness in internal resistance, precision of battery voltage measured by the voltage measurement section, the number of internal space-sharing battery cells in each battery case, etc., and an abnormal battery detection section detects an abnormal battery based on the measured battery voltage value. Therefore, it is possible to prevent the abnormal battery from being mistakenly detected at a battery cell level, thereby improving the reliability of the battery pack.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A battery control device for controlling charging and discharging operations performed on a battery pack in which a plurality of serially-connected battery blocks each include a number of battery cells, the device comprising:

a voltage measurement section for measuring a battery voltage value for each battery block; and an abnormal battery detection section for detecting an abnormal battery based on the battery voltage value measured by the voltage measurement sections, wherein each battery block has a number of cells determined based on at least one battery characteristic.

2. A battery control device according to claim 1, wherein the prescribed condition based on the at least one battery characteristic is at least any one of unevenness in internal resistance, precision in battery voltage measured by the voltage measurement section, and the number of battery cells sharing an internal space in each battery case.

3. A battery control device according to claim 1, wherein the number N of the battery cells in each battery block is determined according to any one of the following conditions (1) through (6):

(1) Max ($|I1|$, $|I2|$)×2ΔR0×N<Valm, where I1 denotes current input to battery cell (I1≠0), I2 denotes current output from the battery cell (I2≠0), N denotes a positive integer, a range of abnormal detection current of a battery is I1 to I2 ($|I1|\geq|I2|$) (ampere), unevenness in internal resistance of a battery cell is ±ΔR0 (ohm), and a voltage value per battery cell determined by battery characteristics is Valm (volt);

(2) I2 denotes discharge current and Valm denotes electric potential at which hydrogen is generated from a battery electrolyte according to condition (1);

(3) both I1 and I2 denote current values in the vicinity of zero, and Valm denotes an open-circuit voltage of the battery cell;

(4) a voltage detection unit N obtained according to condition (1) is multiplied by the precision, ±Δ Vacy (%), of a voltage detection unit system, such that
   Max($|I1|$, $|I2|$)×2ΔR0×2 ΔVacy×N<Valm;

(5) Max($|I1|$, $|I2|$)×2ΔR0×N<Ralm×Max ($|I1|$, $|I2|$);

where I1 denotes current input to a battery (I1≠0), I2 denotes current output from a battery (I2≠0), N denotes a positive integer, a range of abnormal detection current of a battery is I1 to I2 ($|I1|\geq|I2|$) (ampere), unevenness in internal resistance of a battery cell is ±ΔR0 (ohm), and internal resistance per battery cell determined by battery characteristics is Ralm (ohm); and (6) in a battery pack including battery blocks having space-sharing structure between battery cells,
   N0≦N≦A×N0, where the number of space-sharing battery cells is A (A is a positive integer), and N determined according to the conditions (1)–(5) is N0.

* * * * *